(12) United States Patent
Nandi et al.

(10) Patent No.: US 8,791,845 B2
(45) Date of Patent: Jul. 29, 2014

(54) CIRCUITRY AND METHOD FOR REDUCING AREA AND POWER OF A PIPELINCE ADC

(75) Inventors: Gautam S. Nandi, Bangalore (IN); Rishubh Khurana, Delhi (IN)

(73) Assignee: Texas Instruments Incorporated, Dallas, TX (US)

( * ) Notice: Subject to any disclaimer, the term of this patent is extended or adjusted under 35 U.S.C. 154(b) by 76 days.

(21) Appl. No.: 13/600,559

(22) Filed: Aug. 31, 2012

(65) Prior Publication Data

US 2014/0062736 A1 Mar. 6, 2014

(51) Int. Cl.
- H03M 1/06 (2006.01)
- H03M 1/10 (2006.01)
- H03M 1/12 (2006.01)

(52) U.S. Cl.
CPC ............. H03M 1/1009 (2013.01); H03M 1/12 (2013.01)
USPC ........... 341/120; 341/118; 341/155; 341/161; 341/162

(58) Field of Classification Search
CPC ......... H03M 1/12; H03M 1/46; H03M 1/164; H03M 1/172; H03M 1/1009
USPC ............................ 341/118, 120, 155, 161, 162
See application file for complete search history.

(56) References Cited

U.S. PATENT DOCUMENTS

| | | | |
|---|---|---|---|
| 6,369,744 B1 * | 4/2002 | Chuang ........................ | 341/161 |
| 7,071,856 B2 * | 7/2006 | Tsai et al. ..................... | 341/120 |
| 7,095,346 B2 * | 8/2006 | Bogner ......................... | 341/120 |
| 7,148,832 B2 * | 12/2006 | Wada et al. ................... | 341/155 |
| 7,161,521 B2 | 1/2007 | Nandi et al. | |
| 7,372,391 B1 | 5/2008 | Courcy et al. | |
| 7,602,323 B2 * | 10/2009 | Galton et al. ................. | 341/118 |
| 7,612,703 B2 * | 11/2009 | Chen et al. .................... | 341/172 |
| 7,671,769 B2 * | 3/2010 | Cesura et al. ................. | 341/118 |
| 7,786,910 B2 * | 8/2010 | Ali et al. ........................ | 341/131 |
| 8,018,370 B2 * | 9/2011 | Thomas et al. ............... | 341/162 |
| 8,094,056 B2 * | 1/2012 | Nazemi et al. ................ | 341/161 |
| 8,451,154 B2 * | 5/2013 | Erdmann et al. ............. | 341/120 |
| 2005/0242982 A1 | 11/2005 | Hughes | |
| 2005/0275571 A1 | 12/2005 | Bjornsen | |
| 2006/0114144 A1 | 6/2006 | Lyden et al. | |
| 2006/0227025 A1 | 10/2006 | El-Sankary et al. | |
| 2013/0187802 A1 * | 7/2013 | de Figueiredo ............... | 341/118 |

* cited by examiner

*Primary Examiner* — Linh Nguyen
(74) *Attorney, Agent, or Firm* — Alan A. R. Cooper; Frederick J. Telecky, Jr.

(57) ABSTRACT

A pipeline ADC (analog-to-digital converter) (14) includes a residue amplifier (7) for applying a first residue signal (Vres1) to a first input of a residue amplifier (11A) and to an input of a sub-ADC (8) for resolving a predetermined number (m) of bits and producing a redundancy bit in response to the first residue signal. A level-shifting MDAC (9A) converts the predetermined number of bits and the redundancy bit to an analog signal (10) on the a second input of the residue amplifier, which amplifies the difference between the first residue signal and the analog signal to generate a second residue signal (Vres2). The MDAC causes the residue amplifier to shift the second residue signal back within a predetermined voltage range (±Vref/2) by the end of the amplifying if the second residue signal is outside of the predetermined voltage range.

20 Claims, 7 Drawing Sheets

FIG. 7B

US 8,791,845 B2
CIRCUITRY AND METHOD FOR REDUCING AREA AND POWER OF A PIPELINCE ADC

BACKGROUND OF THE INVENTION

The present invention relates generally to improvements which increase the linearity of pipeline ADCs (analog-to-digital converters), and more particularly to improvements which substantially reduce the number of "next stage comparators" in the pipeline ADC. The invention relates yet more particularly to improvements which also reduce the amount of integrated circuit chip area and power dissipation compared to that of prior pipeline ADCs.

Figure 1:
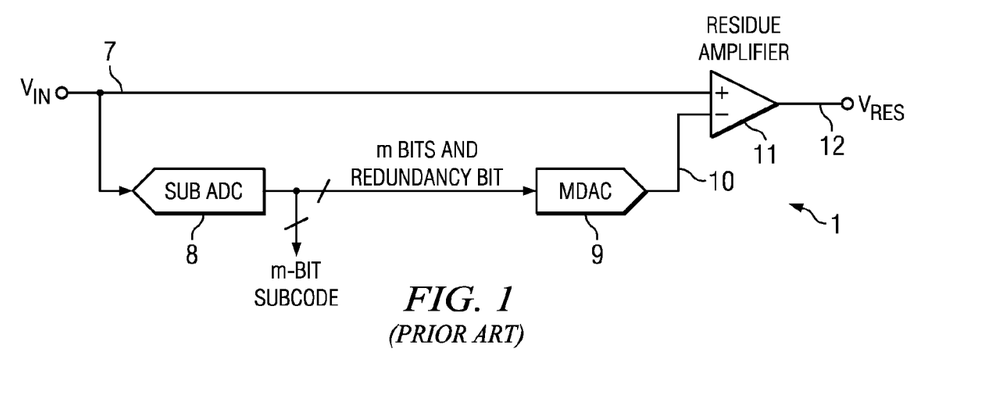
FIG. 1 is a block diagram of a conventional pipeline ADC stage.
Figure 2:
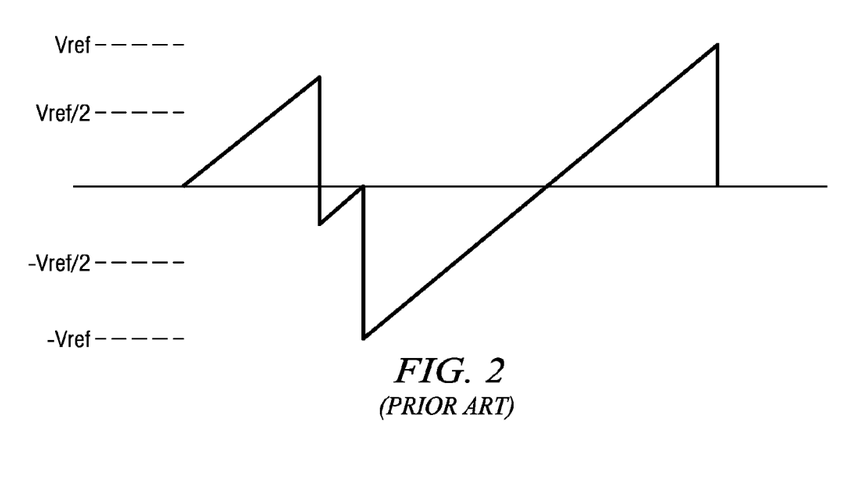
FIG. 2 is a residue plot of the conventional pipeline ADC stage of FIG. 1.

A pipeline ADC includes a sequence of pipeline ADC "stages". FIG. 1 shows a single conventional pipeline ADC stage 1 wherein an analog input signal $V_{IN}$ is applied by conductor 7 to the input of a sub-ADC 8 and to the (+) input of a residue amplifier 11. Sub-ADC 8 typically is implemented by means of a flash ADC. The digital output of sub-ADC 8 is applied to the input of a conventional multiplier DAC (MDAC) 9, the output of which is applied to the (−) input of residue amplifier 11, which produces a residue voltage $V_{RES}$ on conductor 12. A residue plot for pipeline ADC stage 1 is shown in FIG. 2. (A flash ADC typically includes a string of equal resistors connected in series as a voltage divider between a pair of reference voltages to generate individual reference voltages on various circuit nodes or tap points between the respective resistors. Each individual reference voltage may be connected to the (+) input of a corresponding comparator, and the (−) input of each comparator may be connected to an analog input voltage. The comparator outputs provide a digital representation of the analog input voltage.)

In the operation of a conventional pipeline ADC there is just one amplification phase, which is called a "hold" phase because it is accomplished by means of a sample/hold circuit wherein $V_{IN}$ is sampled during a sample phase and amplified during a hold phase. The accuracy with which the sampling and amplification needs to be performed depends on the resolution of the pipeline ADC.

Various errors generated in the known pipeline ADCs cause nonlinear operation thereof. One source of error is random input offset voltages of the flash comparators of the various stages. Another source of error is random input-referred input offset voltages of the residue amplifiers of the various stages. Yet another, error is due to variations in the series-connected resistors of the flash ADCs.

The sub-ADC 8 of FIG. 1 typically generates m bits of sub-ADC code, plus a redundancy bit, if needed, to allow correction of some of the above errors. A known technique for eliminating the effect of the foregoing sources of error on the linearity of a pipeline ADC is referred to as providing "redundancy" in the various pipeline ADC stages. The redundancy is accomplished by providing sub-ADCs with a larger number of bits than the number of bits to be resolved by the various stages, respectively. For example, addition of one or more redundancy bits to the sub-ADC in each pipeline ADC stage except the first stage introduces redundancy, and the redundancy is effective to correct sub-ADC errors generated in the previous stage. For example, if the sub-ADC of a stage of the pipeline ADC is required to resolve 3 bits, then providing a fourth bit introduces redundancy by providing one additional bit of resolution in the sub-ADC of the next pipeline ADC stage. The redundancy provides additional range for the swing of the residue amplifier output voltage, and that additional range is used to correct for the error generated in the previous stage. However, the redundancy bit is not used as part of the sub-ADC code generated by that sub-ADC. (In an ideal circuit, the sub-ADC would not have any error so no redundancy bit would be required.)

An ideal pipeline ADC stage that resolves n effective bits has an n-bit sub-ADC and therefore $2^n$ comparators in the sub-ADC. The gain of the residue amplifier of the stage also needs to be $2^n$. However, in the presence of redundancy of 1-bit, the sub-ADC resolution has to be increased to (n+1) bits and therefore the number of comparators has to be increased to $2^{n+1}$. The residue amplifier gain still remains equal to $2^n$. In other words, the gain of the residue amplifier is reduced by a factor of ½ as compared to the resolution of the sub-ADC. Since the gain of the residue amplifier is reduced by half, its output voltage $V_{RES}$ then will have a dynamic range that spans ±Vref/2, rather than ±Vref as in the ideal case wherein there are no errors in the sub-ADC comparators. The extra dynamic range between −Vref and −Vref/2 and between +Vref/2 and +Vref corresponds to be the actual "redundancy" that is "used" to correct errors in the sub-ADC comparators of the pipeline ADC stage. In summary, the pipeline ADC stage with redundancy requires double the number of comparators in the sub-ADC as compared to an ideal pipeline ADC stage.

The ideal pipeline ADC stage which has no errors from the sub-ADC requires ideal comparators that have "zero" input-referred offset. Since this is not achievable in practice, redundancy is added, as explained above, in the conventional pipeline ADC stage. Redundancy makes the design of the sub-ADC feasible, but the comparator input offset specification is still "tight" enough to necessitate use of a preamplifier stage in each of the comparators to amplify the comparator input signal before it is passed on to a latch that makes the comparator decision. The preamplifier stage in each comparator requires undesirably large amounts of additional chip area and power dissipation. This limitation is especially large for ADCs having higher than 10-bit resolution.

A "cost" or drawback of using a redundancy bit in a pipeline ADC stage is that the number of flash ADC comparators in the pipeline ADC stage must be doubled.

Since the residue voltage $V_{RES}$ produced by the residue amplifier of each pipeline ADC stage needs to be able to swing accurately between ±Vref, the first stage (or first few stages) of a high-resolution pipeline ADC requires the residue amplifier of each such stage to have high DC gain and high bandwidth. Unfortunately, this complicates the design of the residue amplifier of each pipeline ADC stage. A technique that has been used to solve the design complications is referred to as "reference scaling", and is disclosed in commonly assigned U.S. Pat. No. 7,161,521 entitled "Multi-Stage Analog to Digital Converter Architecture" issued Jan. 9, 2007 to Nandi et al.; this patent is entirely incorporated herein by reference. In the reference scaling technique, the gain of the residue amplifier of the flash ADC of each pipeline ADC stage following the first stage is reduced further by a factor of 2. The gain of the residue amplifier for a pipeline ADC stage that resolves n "effective" bits is made equal to $2^{n-1}$, instead of $2_n$. In this way, the output swing of the residue amplifier is reduced by a factor of 2. In the presence of sub-ADC errors, the maximum output swing of the residue amplifier is limited to +/−Vref/2, as compared to +/−Vref in case of the conventional stage. (The output swing of an ideal pipeline stage is +/−Vref/4 when the reference scaling technique is used, as opposed to +/−Vref/2 for a conventional stage.)

When reference scaling is used, the residue amplifier output voltage has to swing between ±Vref/2. This allows design of the residue amplifier to be substantially simplified. However, a disadvantage of reference scaling is that the input offset specification requirements are substantially increased for the flash ADC comparators in the sub-ADC of the next pipeline ADC stage. That makes it necessary to use substantially larger, substantially more power-consuming comparator circuitry. Reference scaling reduces residue amplifier output voltage swing, and also reduces the DC gain and bandwidth requirements of the residue amplifier. Unfortunately, this tightens the input offset specification requirement of the flash ADC comparators of the following stage. The next pipeline ADC stage requires $2^{m+1}$ comparators to span an input range from −Vref/2 to +Vref/2, where m is the number of bits to be resolved the by that pipeline ADC stage. In the absence of the previously mentioned error sources, only $2^m$ comparators spanning −Vref/2 to +Vref/2 would be needed. For example, a 12-bit ADC having four 3-bit pipeline ADC stages arranged in a 3-3-3-3 configuration would require a total of 56 flash ADC comparators. If reference scaling is used, the cost and power dissipation of the pipeline ADC would be substantially increased because each flash ADC comparator would need to be composed of substantially larger, substantially more power-consuming circuitry. Although the reference scaling architecture solves the previously mentioned problems caused by large residue amplifier output voltage swings, reference scaling does not change the requirement of doubling the number of flash ADC comparators if redundancy bits are introduced.

Figure 3:
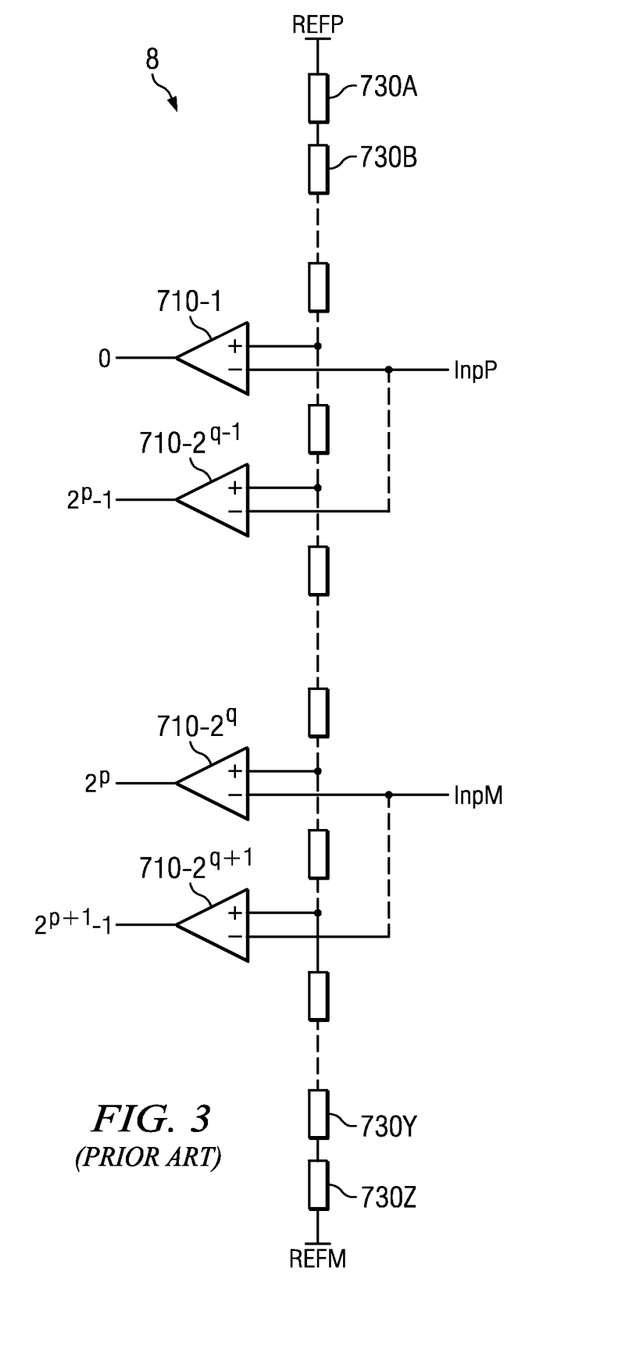
FIG. 3 is a diagram of a sub-ADC which may be used in block 8 of FIG. 1.

FIG. 3 is a copy of FIG. 7A of above-mentioned U.S. Pat. No. 7,161,521, and illustrates a conventional flash ADC 8 which may be used as the sub-ADC in block 8 of FIG. 1. Flash ADC 8 includes comparators 710-1 through 710-$2^{q+1}$ are connected to comparators 710-1 and $2^{q+2}$+1 equal resistors 730A-730Z. Flash ADC 8 is assumed to be generating a q-bit sub-code based on a differential reference input REFP-REFM which is equal to Vref. Resistors 730A-730Z operate as a resistor ladder network which divides the foregoing reference voltage Vref into equal voltage steps. The resistor ladder network generates $2^{q+2}$ levels, the $2^{q+1}$ level middle half of which are connected to the (+) inputs of comparators 710-1 through 710-$2^{q+2}$. Note that one-fourth of the generated $2^{q+2}$ levels located on each side, respectively, of the middle half are not connected to any comparator inputs. (It should be understood that $2^q$ comparators and $2^{q+1}$ resistors, would be required in the case of a single-ended implementation.) Comparators 710-1 through 710-$2^{q+1}$ provide a q-bit sub-code by comparing the differential analog input signal InpP-InpM with the corresponding $2^{q+1}$ middle half levels generated by the resistor ladder network. As a result, the differential analog input signal InpP-InpM is compared within the dynamic range of REFP/2 and REFM/2. The output of the flash ADC comparators represents a sub-code generated by sub-ADC 8.

There is an unmet need for an accurate, linear pipeline ADC which requires substantially less integrated circuit chip area and power dissipation than prior pipeline ADCs that have otherwise essentially similar performance.

There also is an unmet need for an accurate, linear pipeline ADC which avoids problems associated with pipeline ADCs that utilize reference scaling.

There also is an unmet need for a technique for reducing the difficulty of designing the components of a high-resolution pipeline ADC.

SUMMARY OF THE INVENTION

It is an object of the invention to provide an accurate, linear pipeline ADC and method which require substantially less integrated circuit chip area and power dissipation than prior pipeline ADCs that have otherwise essentially similar performance.

It is another object of the invention to provide an accurate, linear pipeline ADC which avoids problems associated with pipeline ADCs that utilize reference scaling.

It is another object of the invention to provide a technique for reducing the difficulty of designing the sub-ADC of a high-resolution pipeline ADC.

It is another object of the invention to provide a technique for reducing the number of comparators required in the flash ADC of a next pipeline ADC stage in a pipeline ADC when redundancy bits are used.

It is another object of the invention to provide an improved way of limiting the output voltage swing of a residue amplifier to voltage to levels between ±Vref/2 without using the known reference scaling technique.

Briefly described, and in accordance with one embodiment, the present invention provides a pipeline ADC (analog-to-digital converter) (14) which includes a residue amplifier (7) for applying a first residue signal (Vres1) to a first input of a residue amplifier (11A) and to an input of a sub-ADC (8) for resolving a predetermined number (m) of bits and producing a redundancy bit in response to the first residue signal. A level-shifting MDAC (9A) converts the predetermined number of bits and the redundancy bit to an analog signal (10) on a second input of the residue amplifier, which amplifies the difference between the first residue signal and the analog signal to generate a second residue signal (Vres2). The MDAC causes the residue amplifier to shift the second residue signal back within a predetermined voltage range (±Vref/2) by the end of the amplifying if the second residue signal is outside of the predetermined voltage range.

In one embodiment, the invention provides a pipeline ADC (analog-to-digital converter) (14) including a pipeline ADC stage (15) including a residue amplifier (11A) having a first (+) input coupled to receive a first residue signal (e.g., Vres1) of a previous ADC stage (e.g., 15-1 or 15-2). A first sub-ADC (8) has an input coupled to receive the first residue signal (Vres1) for resolving a predetermined number (m) of bits and producing the predetermined number (m) of bits and a redundancy bit in response to the first residue signal (Vres1). A first DAC (digital-to-analog converter) (9A) converts the predetermined number (m) of bits and the redundancy bit to an analog signal (10) applied to a second (−) input of the residue amplifier (11A). The DAC (9A) has a level-shifting input ($V_{LS}$) for receiving a feedback signal ($V_{FB}$), the residue amplifier (11A) amplifying a difference between the residue signal (Vres1) and the analog signal (10) to generate a second residue signal (Vres2). Level-detect circuitry (17,18,22) receives the second residue signal (Vres2) and generates the first feedback signal ($V_{FB}$) if the second residue signal (Vres2) is outside of a predetermined voltage range (±Vref/2) so as to cause the first DAC (9A) to shift the second residue signal (Vres2) back within the predetermined voltage range (±Vref/2) by the end of the amplifying. In one embodiment, the previous ADC stage is essentially the same as the pipeline ADC stage (15). In one embodiment, the predetermined voltage range is equal to one half of a reference voltage (Vref) applied to the DAC (9A).

In one embodiment, the previous ADC stage is a first ADC stage (15-1) of the pipeline ADC (14). In one embodiment, the sub-ADC (8) includes $2^m$ comparators the outputs of which produce the resolved bits, where m is an effective number of bits resolved by the pipeline ADC stage, excluding the redundancy bit. In one embodiment, the first sub-ADC (8)

is a m bit flash-ADC. In one embodiment, the DAC (9A) includes an MDAC (multiplying DAC).

In one embodiment, the level-detect circuitry (17,18,22) includes first (17) and second (18) comparators each having an output coupled to an input of a logic circuit (22), a first input (+) of each of the first (17) and (18) comparators being coupled to the second residue signal (Vres2), a second input (−) of the first comparator (17) being coupled to a first reference voltage (+Vref/2) which corresponds to an upper end of the predetermined voltage range (±Vref/2), a second input (−) of the second comparator (18) being coupled to a second reference voltage (−Vref/2) which corresponds to a lower end of the predetermined voltage range (+Vref/2), an output of the logic circuit (22) providing the feedback signal ($V_{FB}$). In one embodiment, the level-detect circuitry (17,18,22) operates in accordance with the truth table if −Vref/2<Vres(coarse)<Vref/2, then $V_{FB}$=zero (so that $V_{RES}$ is not shifted);
if Vref(coarse)>Vref/2, then $V_{FB}$=−Vref (so that $V_{RES}$ is shifted by −Vref); and
if Vref(coarse)←−Vref/2, then $V_{FB}$=+Vref (so that $V_{RES}$ is shifted by +Vref), where Vref is a reference voltage of the pipeline ADC (14), Vres(coarse) is a pre-amplified value of the second residue signal (Vres2), and $V_{FB}$ is the feedback signal.

In one embodiment, the comparators of the sub-ADC (8) are dynamic comparators. In one embodiment, the residue amplifier (11A), the DAC (9A), and sample/hold circuitry are combined in a single circuit module (32).

In one embodiment, the amplifying includes a pre-amplification phase without shifting the value of the second residue signal (Vres2) in response to the feedback signal ($V_{FB}$), followed by a main amplification phase which includes shifting of the second residue signal (Vres2) in response to the feedback signal ($V_{FB}$) to keep the second residue signal (Vres2) within the predetermined voltage range (±Vref/2). In one embodiment, the pre-amplification phase occurs with substantially lower accuracy than the main amplification phase.

In one embodiment, the level-shifting circuitry (64,60A,60B) has an input (23) coupled to the first input (31A,31B) of the residue amplifier (11A). The level-shifting circuitry (64,60A,60B) causes the residue amplifier (11A) to produce a zero level shift of an output (OUTP-OUTM) of the residue amplifier (11A) in response to a "0" level of the feedback signal ($V_{FB}$), a first polarity level shift (+Vref) of the output (OUTP-OUTM) of the residue amplifier (11A) in response to a "1" level of the feedback signal ($V_{FB}$), and a second polarity level shift (−Vref) of an output (OUTP-OUTM) of the residue amplifier (11A) in response to a "−1" level of the feedback signal ($V_{FB}$).

In one embodiment, the invention provides a method of operating a pipeline ADC (analog-to-digital converter) (14) including a pipeline ADC stage (15), the method including applying a first residue signal (e.g., Vres1) to a first (+) input of a residue amplifier (11A) and to an input of a sub-ADC (8) for resolving a predetermined number (m) of bits; operating the sub-ADC (8) to produce the predetermined number (m) of resolved bits and a redundancy bit in response to the first residue signal (e.g., Vres1); converting the predetermined number (m) of resolved bits and the redundancy bit to an analog signal (10) and applying the analog signal (10) to a second (−) input of the residue amplifier (11A); amplifying the difference between the first residue signal (Vres1) and the analog signal (10) to generate a second residue signal (Vres2); and if the second residue signal (Vres2) is outside of a predetermined voltage range (±Vref/2), then causing the residue amplifier (11A) to shift the second residue signal (Vres2) back within the predetermined voltage range (±Vref/2) by the end of the amplifying phase. In one embodiment, the method includes operating level-detect circuitry (17,18,22) in accordance with the truth table if −Vref/2<Vref(coarse)<Vref/2, then $V_{FB}$=zero (so that $V_{RES}$ is not shifted);
if Vref(coarse)>Vref/2, then $V_{FB}$=−Vref (so that $V_{RES}$ is shifted by −Vref); and
if Vref(coarse)←−Vref/2, then $V_{FB}$=+Vref (so that $V_{RES}$ is shifted by +Vref), where Vref is a reference voltage of the pipeline ADC (14), Vres(coarse) is a pre-amplified value of the second residue signal (Vres2), and $V_{FB}$ is the feedback signal.

In one embodiment, the method includes utilizing a DAC (digital-to-analog converter) (9A) having a level-shifting input (23) to shift the second (−) input of the residue amplifier (11A) so as to superimpose a level shift on the second residue signal (Vres2) so as to shift it back within the predetermined voltage range.

In one embodiment, the method includes providing $2^{m-1}$ comparators in the sub-ADC (8).

In one embodiment, the invention provides a pipeline ADC (analog-to-digital converter) (14), including means (7) for applying a first residue signal (e.g., Vres1) to a first (+) input of a residue amplifier (11A) and to an input of a sub-ADC (8) for resolving a predetermined number (m) of bits; means (710-1,2 . . . 730A,B . . . in FIG. 3) in the sub-ADC (8) for producing the predetermined number (m) of bits and a redundancy bit in response to the first residue signal (e.g., Vres1); means (9A) for converting the predetermined number (m) of bits and the redundancy bit to an analog signal (10) and applying the analog signal (10) to a second (−) input of the residue amplifier (11A); means (FIG. 7A) for amplifying the difference between the first residue signal (Vres1) and the analog signal (10) to generate a second residue signal (Vres2); and means (17,18,22,9A) for causing the residue amplifier (11A) to shift the second residue signal (Vres2) back within the predetermined voltage range (±Vref/2) by the end of the amplifying if the second residue signal (Vres2) is outside of a predetermined voltage range (±Vref/2).

DETAILED DESCRIPTION OF THE PREFERRED EMBODIMENTS

An improvement to conventional "pipeline ADC stages" for a pipeline ADC is provided which avoids the need to double the number of flash ADC comparators of a "next" pipeline ADC stage when redundancy bits are used to improve the linearity of the pipeline ADC. The improvement is accomplished by using residue voltage level detecting circuitry which detects an out-of-range excursion of the residue voltage and accordingly provides feedback that shifts the residue voltage back into the desired range for each pipeline ADC stage following the first stage.

Figure 4A:
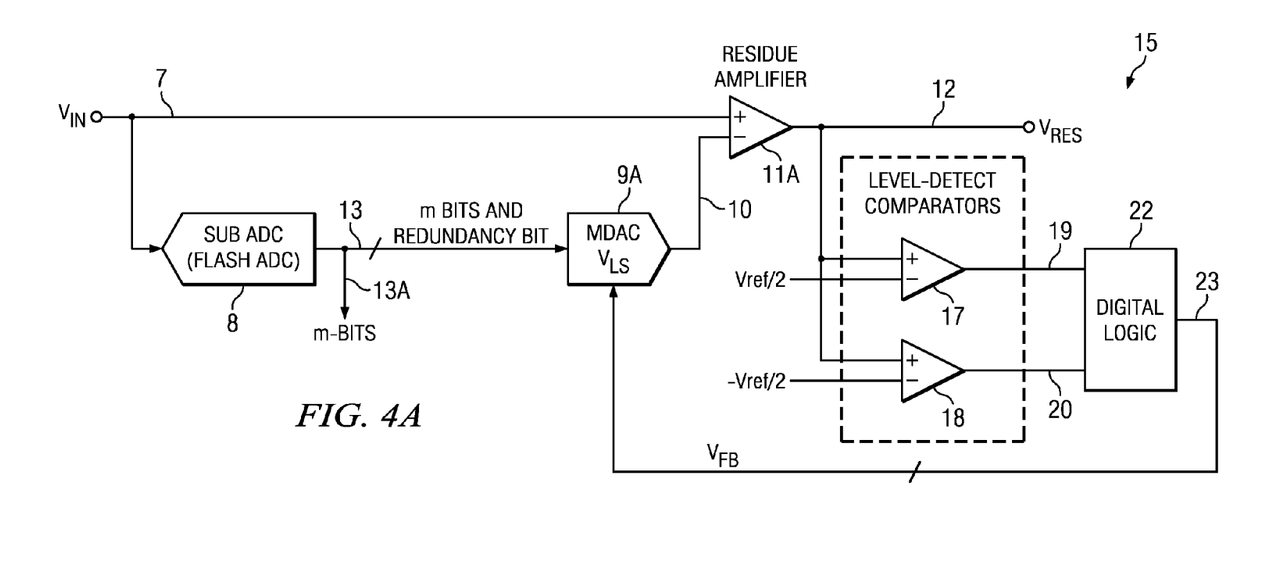
FIG. 4A is a block diagram of a pipeline ADC stage in accordance with the present invention.

FIG. 4A shows a new pipeline ADC stage 15 wherein analog input signal $V_{IN}$ (which typically is the residue voltage of a previous pipeline ADC stage) is applied by conductor 7 to the input of a sub-ADC 8 and also to the (+) input of a residue amplifier 11A. Sub-ADC 8 may be implemented by means of a flash ADC 8, which is commonly used in conventional pipeline ADCs. Flash ADC 8 in FIG. 4A is similar to the one shown in Prior Art FIG. 3 except that the number of resistors is equal to $2^{q+1}+1$, as there are no untapped resistors at the top and bottom of the resistor string. The total number of comparators in sub-ADC 8 of FIG. 4A is equal to $2^{q+1}$. In accordance with the embodiment of the invention shown in FIG. 4A, the number of comparators is reduced by half, ie., to $2^q$, whereas the resistor string is the same as in Prior Art FIG. 3, and this is applicable for the flash ADC of all stages of the pipeline ADC except the first stage.

Figures 6, 8:
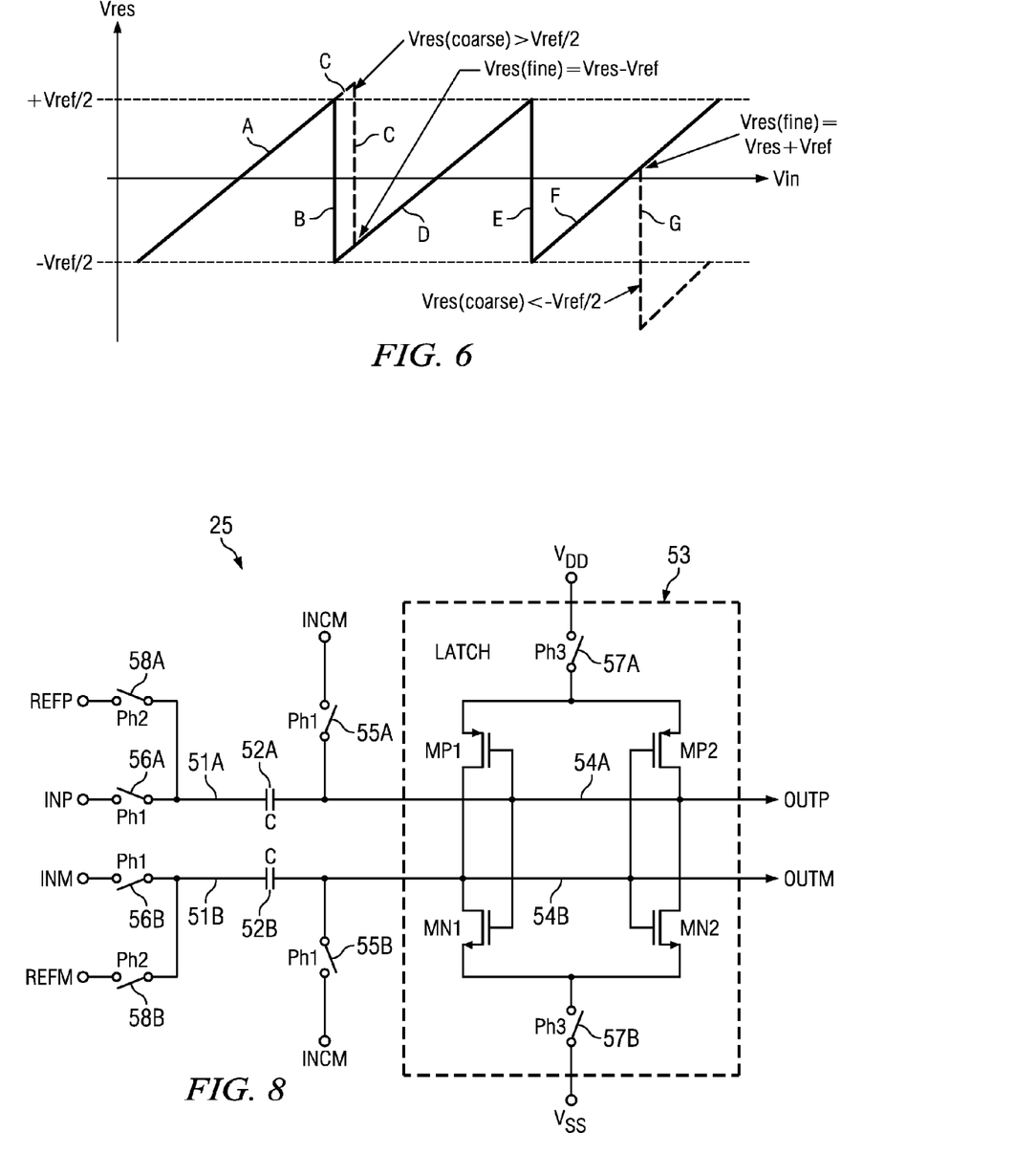
FIG. 6 is a plot of the residue curve of the pipeline ADC stage of FIG. 4A for both pre-amplification and main-amplification.
FIG. 8 is a detailed schematic diagram of a dynamic comparator circuit which may be utilized in blocks 17 and 18 of FIG. 4A.

In FIG. 4A, the digital output of sub-ADC 8 is applied via bus 13 to the input of a MDAC 9A, the output conductor 10 of which is connected to the (−) input of residue amplifier 11A. MDAC 9A also receives a feedback signal $V_{FB}$ produced on conductor or bus 23 by level-detect circuitry including residue-level-detect comparators 17 and 18 and digital logic circuit 22. Residue amplifier 11A produces an output voltage or residue voltage $V_{RES}$ on conductor 12, which is connected to the (+) inputs of comparators 17 and 18. The (−) inputs of comparators 17 and 18 are connected to comparator threshold voltages Vref/2 and −Vref/2, respectively. A residue plot for pipeline ADC stage 15 is shown in FIG. 6. Subsequently described FIGS. 7A and 7B clarify how the feedback levels +Vref are superimposed on the normal output of MDAC 9A.

Pipeline ADC stage 15 of FIG. 4A helps to avoid costs/drawbacks associated with using the prior art reference scaling technique by connecting output 12 of residue amplifier 11A to the (+) inputs of level-detect comparators 17 and 18, which have input threshold voltages set at −Vref/2 and +Vref/2, respectively. In the presence of amplified errors generated in the previous stage, if $V_{RES}$ swings beyond ±Vref/2, then one of level-detect comparators 17 and 18 switches and causes logic circuitry 22 to accordingly send a level-shifting feedback voltage $V_{FB}$ to MDAC 9A via bus 23. The outputs 19 and 20 of level-detect comparators 17 and 18, respectively, are applied to inputs of digital logic 22, the output 23 of which is connected to a level-shift input $V_{LS}$ of level-shifting MDAC 9A. The feedback voltage $V_{FB}$ produced in response to level-detect comparators 17 and 18 is used to prevent $V_{RES}$ from going outside of the range between ±Vref/2.

Level-detect comparators 17 and 18 detect whether residue amplifier output voltage $V_{RES}$ is between ±Vref/2 (and therefore also detect whether $V_{RES}$ is higher than +Vref/2 or lower than −Vref/2). Digital logic circuit 22 produces no feedback on bus 23 if $V_{RES}$ is between ±Vref/2. However, if $V_{RES}$ is less than −Vref/2, then digital logic circuit 22 produces a +Vref level on feedback bus 23. If $V_{RES}$ is greater than +Vref/2, then digital logic circuit 22 produces a −Vref level on feedback bus 23. That is, digital logic circuit 22 operates in accordance with the following truth table:

TABLE 1 if −Vref/2 < Vref(coarse) < Vref/2, then $V_{FB}$ = zero (so that $V_{RES}$ is not shifted);
if Vref(coarse) > Vref/2, then $V_{FB}$ = −Vref (so that $V_{RES}$ is shifted by −Vref); and
if Vref(coarse) < −Vref/2, then $V_{FB}$ = +Vref (so that $V_{RES}$ is shifted by +Vref).

This means that the final residue amplifier output $V_{RES}$ at the end of the amplification process is not shifted at all, and always remains within the range ±Vref/2, as indicated by the solid line curve in the residue plot of FIG. 6. The feedback voltage $V_{FB}$ keeps $V_{RES}$ between ±Vref/2, and thereby avoids the need to double the number of flash-ADC comparators in the next stage (if redundancy bits are used in each pipeline ADC stage), since there is no need for flash ADC comparators to detect tap point voltages of the resistor network having values between Vref and Vref/2 and values between −Vref/2 and −Vref. The digital logic 63 shown in subsequently described FIG. 7A produces digital level signals −1, 0 and +1 as feedback. Additional decoding circuitry 64 in the MDAC 9A, as indicated in FIG. 7B, converts those digital signals to an equivalent voltage level shifts of +Vref, 0 or −Vref.

Figure 4B:
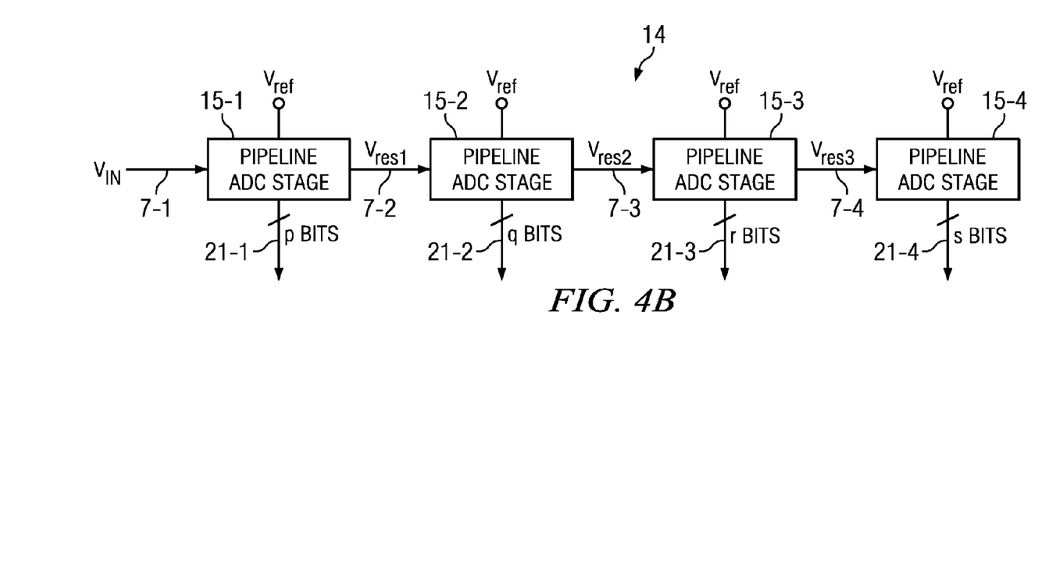
FIG. 4B is a block diagram of a pipeline ADC including a sequence of the pipeline ADC stages shown in FIG. 4A.

FIG. 4B shows a N-bit pipeline ADC 14 composed of 4 pipeline ADC stages 15-1,2,3,4 each having the basic configuration shown in FIG. 4A. Stages 15-1,2,3, are assumed to resolve p, q, r, and s bits, respectively, where N is equal to p+q+r+s. (In the example described herein, N is equal to 12 and each of p, q, r, and s is equal to 3.) The input conductor 7-1 of input stage 15-1 receives input voltage $V_{IN}$ which is to be converted to a digital representation by N-bit pipeline ADC 14. Stage 15-1 generates a p-bit digital code on digital bus 21-1, and also generates a residue voltage Vres1 on conductor 7-2, which is connected to the analog input of pipeline ADC stage 15-2. Similarly, stage 15-2 generates a q-bit digital code on digital bus 21-2, and also generates a residue voltage Vres2 on conductor 7-3, which is connected to the analog input of pipeline ADC stage 15-3. Stage 15-3 generates a r-bit digital code on digital bus 21-3, and also generates a residue voltage Vres3 on conductor 7-4, which is connected to the analog input of pipeline ADC stage 15-4. (Note that Vres1, Vres2, . . . are particular values of generated by a residue amplifier 11A as in FIG. 4A.) The last stage 15-4 generates a s-bit digital code on digital bus 21-4, and also generates an internal residue voltage Vres4 (not shown). Each of stages 15-1,2,3,4 is biased by a reference voltage Vref. The resolved p, q, r, and s bits constitute the digital representation of $V_{IN}$.

In one example, a redundancy bit is provided in each of stages 15-2,3,4 in FIG. 4B, in order to eliminate the ADC nonlinearity caused by the previously mentioned error sources. However, the redundancy bits are not resolved by the various pipeline ADC stages and do not appear on bus 21-1, 2,3,4 as part of the N-bit output generated by pipeline ADC 14.

Figure 5A:
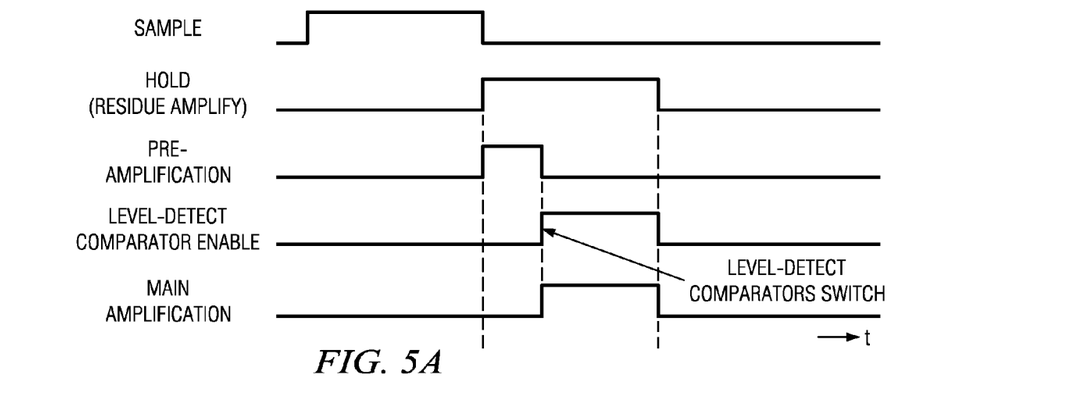
FIG. 5A is a timing diagram for the pipeline ADC stage of FIG. 4A.

FIG. 5A shows a timing diagram for pipeline ADC stage 15 of FIG. 4A and pipeline ADC 14 of FIG. 4B. The SAMPLE signal is input to sample/hold circuitry (shown in FIGS. 7A and 7B) which samples the signals produced by the flash ADCs 8 of the various pipeline ADC stages. The SAMPLE phase is the interval during which the analog input to the ADC stage is, in effect, sampled. The HOLD phase is the entire time interval which is available for performing amplification of the residue voltages Vres1, Vres2, . . . of the various pipeline ADC stages. Each overall residue amplification process includes a "course" pre-amplification operation followed by a "fine" main amplification operation.

Figure 7A:
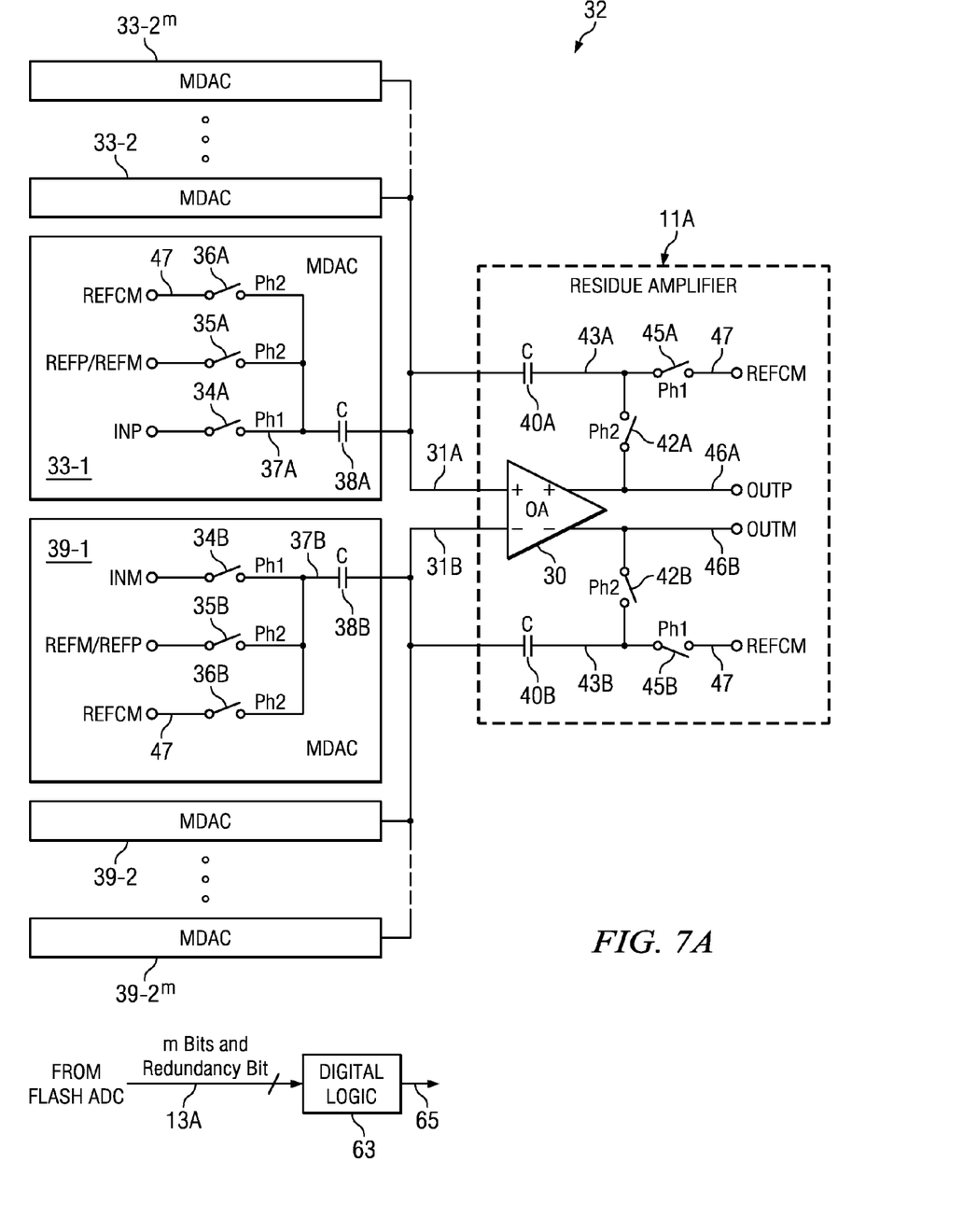
FIG. 7A is a detailed schematic diagram of the residue amplifier in block 11A.
Figure 7B:
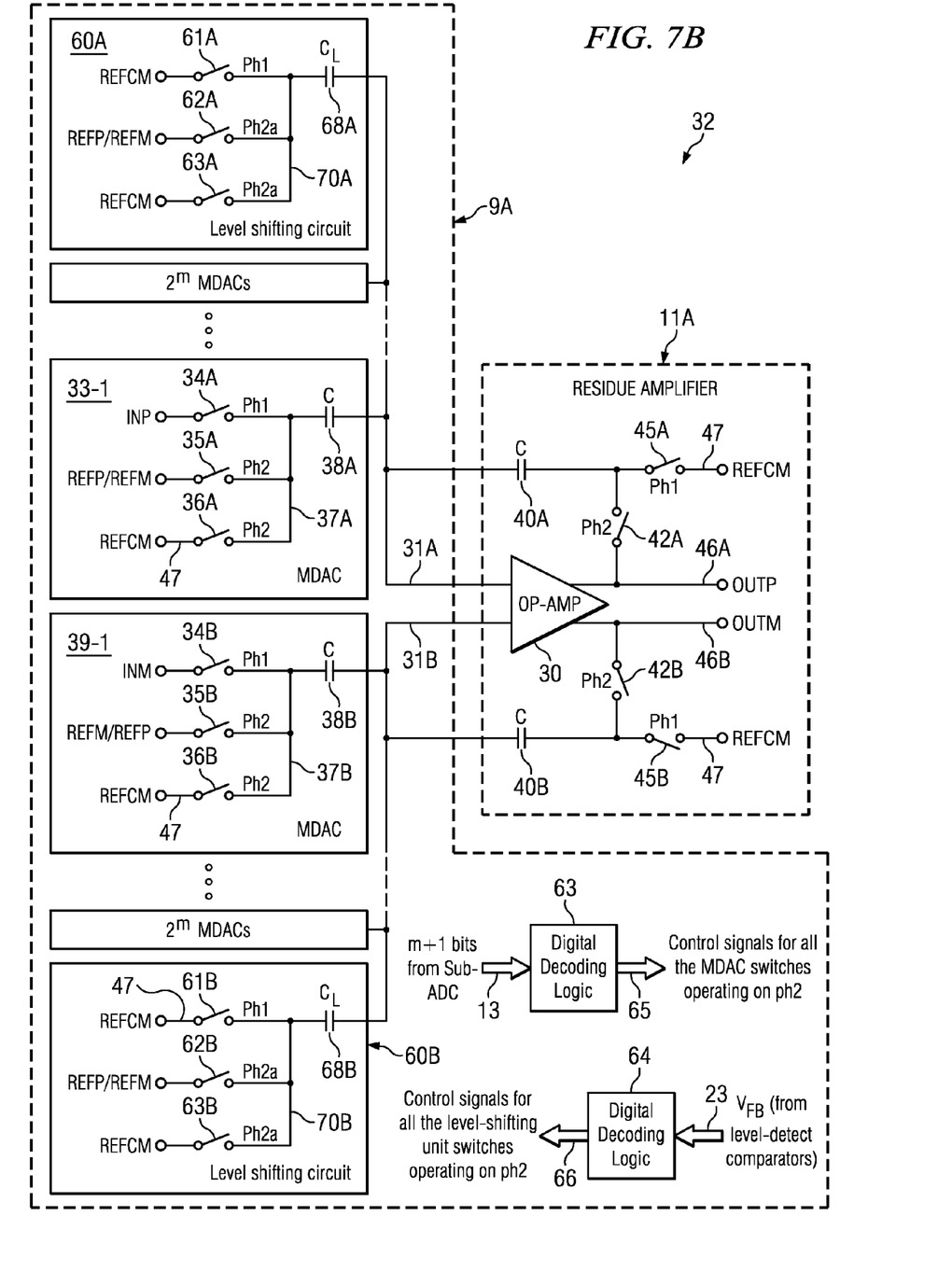
FIG. 7B is a more detailed schematic diagram of the residue amplifier in block 11A which illustrates level shift circuitry associated with the circuitry shown in FIG. 7A.

FIG. 7A illustrates an implementation in which MDAC 9A, the previously mentioned sample and hold circuitry, and residue amplifier 11A are integrated into a single circuit "module". Referring to FIG. 7A, residue amplifier 11A and MDAC 9A shown in pipeline ADC 15 of FIG. 4A are combined, along with suitable sample/hold circuitry, in a single circuit or "module" 32. Module 32 functions similarly to a sample and hold amplifier along with a built-in DAC function. Residue amplifier 11A in FIG. 7A includes an operational amplifier 30 having its (+) input connected by conductor 31A to one terminal of a feedback capacitor 40A of capacitance C. The other terminal of feedback capacitor 40A is connected by conductor 43A to one terminal of each of switches 42A and 45A. The other terminal of switch 42A is connected by conductor 46A to a (+) output of operational amplifier 30, which produces a (+) output signal OUTP on conductor 46A. The other terminal of switch 45A is connected to a conductor 47 which receives a common mode reference voltage REFCM. Similarly, the (−) input of operational amplifier 30 is connected by conductor 31B to one terminal of a feedback capacitor 40B of capacitance C. The other terminal of feedback capacitor 40B is connected by conductor 43B to one terminal of each of switches 42B and 45B. The other terminal of switch 42B is connected by conductor 46B to a (−) output of operational amplifier 30, which produces a (−) output signal OUTM on conductor 46B. The other terminal of switch 45B is connected to REFCM conductor 47.

Module 32 in FIG. 7A also includes $2^m$ switching circuits 33-1,2 . . . 33-$2^m$, each of which includes a sampling capacitor 38A of capacitance C having one terminal connected to conductor 31A and another terminal connected by a corresponding conductor 37A to one terminal of each of switches 34A, 35A, and 36A, where m is the number of bits resolved by the pipeline ADC stage 15 that contains module 32. Switch 34A is controlled by clock signal Ph1, and switches 35A and 36A are controlled by Ph2. The other terminal of switch 34A is connected to receive a corresponding input signal INP, which is the (+) input of the ADC stage which goes into both flash sub-ADC 8 and residue amplifier 11A as shown in FIG. 4A. The other terminal of switch 35A is connected to receive either a (+) reference signal REFP or a (−) reference signal REFM, depending on the flash sub-ADC output which is decoded through the digital logic 63 shown in FIG. 7A. The other terminal of switch 36A is connected by conductor 47 to receive REFCM.

Similarly, module or circuit 32 in FIG. 7A also includes $2^m$ switching circuits 39-1,2 . . . 39-$2^m$, each of which includes a sampling capacitor 38B having one terminal connected to conductor 31B and another terminal connected by a corresponding conductor 37B to one terminal of each of switches 34B, 35B, and 36B. Switch 34B is controlled by Ph1, and switches 35B and 36B are controlled by Ph2. The other terminal of switch 34B is connected to receive a corresponding (−) input signal INM, which is the (−) input of the ADC stage which goes into both flash sub-ADC 8 and residue amplifier 11A as shown in FIG. 4A. The other terminal of switch 35B is connected to receive either (+) reference signal REFM or (−) reference signal REFP depending on the flash sub-ADC output which is decoded through digital logic 63.

Ph2 in the MDAC circuitry is same as the "HOLD" phase of timing diagram of FIG. 5A. Depending on the output from flash ADC 8 (FIG. 4A), capacitor 38A is connected either to REFP, REFM or REFCM through switches 35A and 36A. This also applies to capacitor 38B. The other terminal of switch 36B is connected by conductor 47 to receive REFCM.

In this example, the flash ADC 8 of each pipeline ADC stage contains the module 32 of FIG. 7A and produces m "effective" bits to be resolved, and each stage except the first also includes one redundancy bit. The m "effective" bits and the redundancy bit appear on digital bus 13A (FIG. 4A). Digital bus 13A is provided as an input to the digital logic circuit 63 that also is included in module 32. Ph1 is the same as "SAMPLE" phase of FIG. 5A and Ph2 is the same as "HOLD" phase of FIG. 5A. The input signal INP is sampled on capacitor 38A and INM is sampled on capacitor 38B, for all of the MDACs 33-1 through 33-$2^m$ and 39-1 through 39-$2^m$ during the sample phase Ph1. During hold phase Ph2, the capacitor 38A or 38B of a particular MDAC is connected to REFP, REFM or REFCM in response to the control signal 65 produced by digital logic 63, depending on the output of the flash sub-ADC 8. (Recall that the same input INP-INM=$V_{IN}$ goes to flash sub-ADC 8.) The feedback capacitors 40A and 40B are connected to REFCM during sample phase Ph1. Therefore, a "0" is differentially sampled onto feedback capacitors 40A and 40B. In the hold phase Ph2, feedback capacitors 40A and 40B are connected to the output conductors 46A and 46B of operational amplifier 30. By writing equations for the charges on all of the feedback capacitors 40A and 40B and MDAC capacitors 38A and 38B in the sample phase and the hold phase and then equating the total charge during a sample phase to the total charge during a hold phase, subsequently described Equation (1) is obtained for OUTP-OUTM, which is the residue output $V_{RES}$ of the combined MDAC and residue amplification stage 32 shown in FIG. 7A.

The analog input signals INP and INM (which are represented by $V_{IN}$ in the simplified diagrams of FIGS. 4A and 4B) generated by the previous pipeline ADC stage are sampled on corresponding sampling capacitors 38A and 38B of capacitance C during phase Ph1. The MDAC conversion function is achieved by using either REFP/REFM or REFCM during phase Ph2.

Equation (1) set forth below for $V_{RES}$ defines a combined gain and DAC function. Note that OUTP-OUTM is also represented by $V_{RES}$ in FIG. 4A and by Vres in FIG. 4B. As explained above, the input signal INP-INM ($V_{IN}$ in FIGS. 4A and 4B) is sampled on all of the sampling capacitors 33-1 through 33-$2^m$ and 39-1 through 39-$2^m$. Therefore, G=$2^m$ is obtained as the coefficient for INP-INM. In the hold phase Ph2, REFP, REFM or REFCM is connected to each MDAC capacitor depending on the flash ADC output. This gives the coefficient k in Equation (1) for the reference term REFP-REFM, which is equal to Vref. The residue amplifier output voltage $V_{RES}$ is represented by the expression $$V_{RES}=\text{OUT}P-\text{OUT}M=G*(\text{IN}P-\text{IN}M)-k*(\text{REF}P-\text{REF}M) \quad \text{Eqn. (1)}$$

where G=$2^m$, k=$-2^m, -2^{m-1}, -2^{m-2}, \ldots, -1, 0, 1, \ldots, 2^{m-2}, 2^{m-1}, 2^m$, depending on the digital output received from flash ADC 8 by the MDAC circuitry in FIG. 7A, the analog output of which is applied to the (−) input of residue amplifier 11A. Ph1 phase is the same as "SAMPLE" and Ph2 phase is the same as "HOLD" of the timing diagram in FIG. 5B.

Referring to FIG. 7B, module 32 includes MDACs 33-1 and 39-1 of MDAC circuitry 9A and residue amplifier 11A of FIG. 7A. MDAC 9A also includes level-shifting circuits 60A and 60B, and further includes digital decoding logic 63 for generating control signals 65 for all of the MDAC switches that are turned on, i.e., closed, during phase Ph2. MDAC 9A also includes digital decoding logic circuit 64 for generating control signals 66 for all level-shifting circuit switches that are on, i.e., closed, during phase Ph2. Level-shifting circuit 60A includes a level-shifting capacitor 68A of capacitance $C_L=C$ connected between conductor 31A and one terminal of each of switches 61A, 62A, and 63A. The other terminal of switch 61A is connected to common mode reference voltage REFCM. The other terminal of switch 62A is connected to either REFP or REFM, depending on the output of sub-ADC 8. The other terminal of switch 61A is connected to REFCM. Similarly, level-shifting circuit 60B includes a level-shifting capacitor 68B of capacitance $C_L$ connected between conductor 31B and one terminal of each of switches 61B, 62B, and 63B. The other terminal of switch 61B is connected to REFCM. The other terminal of switch 62B is connected to either REFP or REFM, depending on the output of sub-ADC 8. The other terminal of switch 61B is connected to REFCM.

Figure 5B:
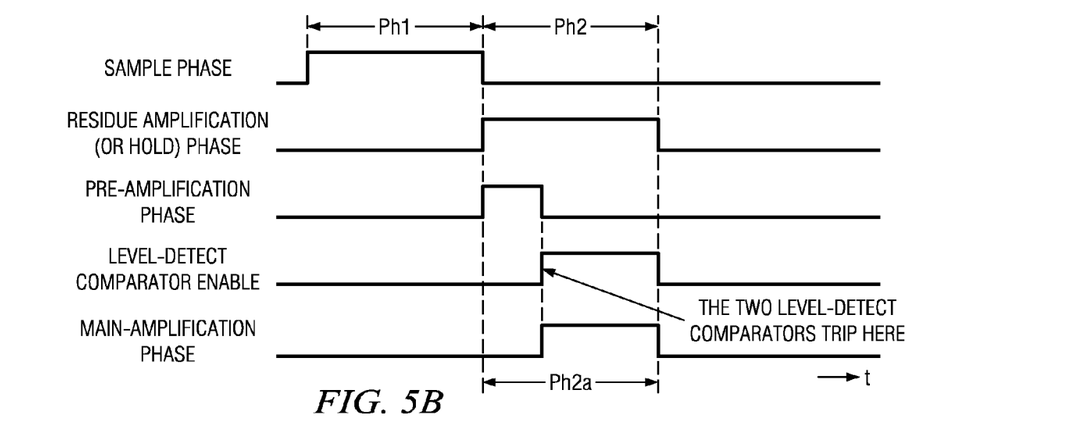
FIG. 5B is a similar timing diagram for the pipeline ADC stage of FIG. 4A, but corresponding to FIGS. 7A and 7B.

The above mentioned level-shifting function is based on feedback signal $V_{FB}$ from the two-level residue-voltage-detecting comparators 17 and 18 (FIG. 4A), and is accomplished by using level-shifting capacitors 68A and 68B of capacitance $C_L$ shown in FIG. 7B. During sample phase Ph1, the level-shifting capacitor nodes 70A and 70B are connected to common mode reference voltage REFCM. Therefore, operational amplifier 30 samples a differential voltage of zero across level-shifting capacitors 68A and 68B during main amplification phase Ph2a as shown in FIG. 5B. Level-shifting capacitors 68A and 68B are connected to REFP, REFM or REFCM, which are generated by decoding logic 64 on the basis of feedback signal $V_{FB}$ from the two-level detect comparators 17 and 18 in FIG. 4A. This results in operation according to the following truth table:

if $V_{FB}$='0', the top and bottom capacitors level-shifting capacitors 68A and 68B are connected to REFCM during Ph2a. This results a level shift of zero to the output OUTP-OUTM produced by residue amplifier 11A, if $V_{FB}$='1', the top and bottom capacitors level-shifting capacitors 68A and 68B are connected to REFCM during Ph2a. This results in a level shift of "+Vref" to the output OUTP-OUTM produced by residue amplifier 11A, and if $V_{FB}$='−1' the top and bottom capacitors level-shifting capacitors 68A and 68B are connected to REFM and REFP, respectively, during Ph2a. This results a level shift of zero to the output OUTP-OUTM produced by residue amplifier 11A.

FIG. 8 illustrates a dynamic flash ADC comparator circuit 25 which may be used in flash ADC comparators 710-1, 710-$2^{q-1}$, 710-$2^q$ and 710-$2^{q+1}$ shown in Prior Art FIG. 3. Dynamic comparator circuit 25 includes a latch circuit 53 and associated switched capacitor input circuitry. Latch circuit 53 includes P-channel MOS transistors MP1 and MP2 and N-channel MOS transistors MN1 and MN2 and also includes switches 57A and 57B controlled by a clock signal Ph-3. The sources of transistors MP1 and MP2 are connected by switch 57A to $V_{DD}$, and the sources of transistors MN1 and MN2 are connected by switch 57B to $V_{SS}$. The gates of transistors MP1 and MN1 are connected to conductor 54A, on which the (+) output signal OUTP of dynamic comparator 25 is generated. Similarly, the gates of transistors MP2 and MN2 are connected to conductor 54B, on which the (−) output signal OUTM of dynamic comparator 25 is generated. The drains of transistors MP1 and MN1 are connected to conductor 54B, and the drains of transistors MP2 and MN2 are connected to conductor 54A.

The associated switched capacitor input circuitry of dynamic comparator circuit 25 in FIG. 8 includes switches 55A, 55B, 56A and 56B all controlled by clock signal Ph1, and also includes switches 58A and 58B which both are controlled by clock signal Ph2. Conductor 54A is connected to one terminal of switch 55A and one terminal of sampling capacitor 52A. The other terminal of switch 55A is connected to the input common mode voltage INCM, which sets the common mode voltage on the other terminal of capacitor 52A based on the common mode voltage of the output signals OUTP and OUTM of latch circuit 53. Latch circuit 53 makes decisions during phase Ph3, as indicated in the timing diagram of FIG. 5C. The other terminal of capacitor 52A is connected by conductor 51A to one terminal of each of switches 56A and 58A. The other terminal of switch 56A is connected to the (+) input of dynamic comparator 25, and the other terminal of switch 58A is connected to receive the (+) reference signal REFP.

Similarly, conductor 54B is connected to one terminal of switch 55B and one terminal of sampling capacitor 52B. The other terminal of switch 55B is connected to the input common mode voltage INCM, which sets the common mode voltage on the other terminal of capacitor 52B based on the common mode voltage of the output signals OUTP and OUTM of latch circuit 53. Latch circuit 53 makes decisions during phase Ph3, as indicated in the timing diagram of FIG. 5C. The other terminal of capacitor 52B is connected by conductor 51B to one terminal of each of switches 56B and 58B. The other terminal of switch 56A is connected to the (+) input of dynamic comparator 25, and the other terminal of switch 58B is connected to receive the (+) reference signal REFM.

Figure 5C:
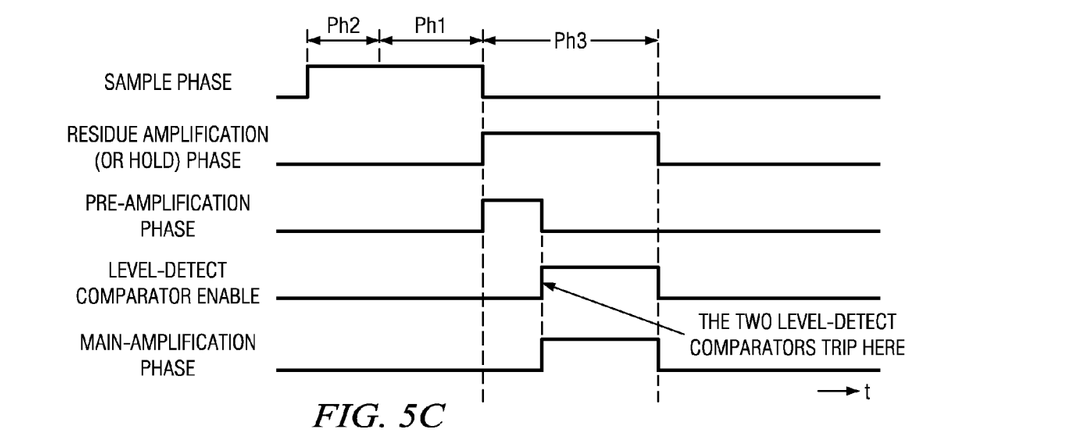
FIG. 5C is a similar timing diagram for the pipeline ADC stage of FIG. 4A, but corresponding to FIG. 8.

In operation, each of the inputs INP and INM of dynamic comparator 25 in FIG. 8 are sampled onto sampling capacitors 52A and 52B, respectively, during phase Ph1 in FIG. 5C. The references REFP and REFN are applied to sampling capacitors 52A and 52B, respectively, during phase Ph2. Latch 53 is enabled by clock signal phase Ph3 just before the end of phase Ph2, and makes a switching decision based on the relative difference between the differential input voltage INP-INM and the differential reference voltage REFP-REFM. Note that INP-INM is the input $V_{IN}$ of FIG. 4A, but REFP-REFM is not the same as Vref and is different for each dynamic comparator 25, depending on the tap of the flash ADC resistor ladder (FIG. 3) to which that dynamic comparator 25 is connected.

To summarize, a cost/drawback of introducing a redundancy bit into a sub-ADC is that it adds one extra bit of resolution to each flash ADC 8, and that means the number of flash ADC comparators of the next pipeline ADC stage 15 must be doubled. One purpose of the invention is to reduce the number of comparators required in the flash ADC 8 of the next pipeline ADC stage 15 when redundancy bits is used. Another purpose of the invention is to limit output voltage swing of residue amplifier 11A to voltage levels between ±Vref/2 without using the previously described reference scaling, because even though reference scaling limits the residue amplifier output voltage swing to ±Vref/2, it also decreases the input offset specification and increases the area and power consumption required by that the flash ADC comparators.

As previously indicated, the residue amplification process in pipeline ADC stage 15 includes a pre-amplification operation followed by a main amplification operation. First, the pre-amplification begins at the beginning of the HOLD phase indicated in the timing diagrams of FIGS. 5A-C, and consists of a "coarse" amplification by residue amplifier 11A to obtain a "coarse" value of $V_{RES}$, which is referred to as Vres(coarse). If errors are being generated in the previous stage, Vres (coarse) will swing either above Vref/2 or below −Vref/2. This condition is detected by one of level-detect comparators 17 and 18 and causes digital logic circuit 22 (FIG. 4A) to generate a value of feedback voltage $V_{FB}$ equal to +Vref or −Vref on bus 23. The "coarse" pre-amplification operation requires less accuracy than the "fine" main amplification operation, and involves larger residue amplifier output voltage swings. Therefore, the same residue amplifier may be used both to provide the more accurate main amplification and the less accurate coarse pre-amplification. Consequently, the additional residue amplifier output voltage swing that occurs during the pre-amplification phase does not necessitate incurring any additional cost in the form of more complex, more accurate residue amplifier circuitry.

After completion of the pre-amplification phase, residue amplifier 11A then operates to generate a much more accurate value of $V_{RES}$, referred to as Vres(fine), based on the feedback voltage $V_{FB}$ derived from level-detect comparators 17 and 18. If swings beyond ±Vref/2 during pre-amplification, then the feedback signal $V_{FB}$ on bus 23 causes MDAC 9A to impose a level shift on its output 10 in FIG. 4A (or between conductors 31A and 31B FIG. 7B) so that residue amplifier 11A produces a corresponding level shift onto $V_{RES}$ during the main amplification phase. This prevents the final value of Vres(fine) from going beyond the range ±Vref/2. This is accomplished by operation of level-detect comparators 17 and 18 and logic circuit 22 in accordance with the truth table previously set forth in Table 1. Therefore, the final residue amplifier output $V_{RES}$ at the end of the amplification process always remains within the ±Vref/2 range, as indicated by the solid line curve in the residue plot of FIG. 6.

Referring to FIG. 6, the residue curve for $V_{RES}$=Vres(fine) in pipeline ADC stage 15 is indicated by the solid line segments A, B, D, E, and F. The residue curve for $V_{RES}$=Vres (coarse) during pre-amplification is indicated by the dashed lines including line segments C and G, where Vres(coarse) may go beyond ±Vref/2 (and in the worst case may reach either of the values ±Vref). In pipeline ADC stage 15 of FIG. 4A, the "pre-amplification residue voltage" $V_{RES}$=Vres (coarse) generated during the pre-amplification phase follows solid line segment A, dashed line segment C, solid line segments D and E, part of segment F, and dashed line segment G.

The accuracy specification of pipeline ADC 14 will always require $V_{RES}$=Vres(fine) to be within the ±Vref/2 as indicated by the solid-line residue curve shown in FIG. 6. The dashed line is the residue voltage plot during pre-amplification, and the solid line is the residue voltage plot during main amplification. During the pre-amplification operation, part of dashed-line section C goes higher than +Vref/2, causing digital logic 22 in FIG. 4A to kick in and generate a $V_{FB}$ value of −Vref which causes a downward level shift in the value of $V_{RES}$ during the main amplification operation. This causes $V_{RES}$ to be less than +Vref/2 during the main amplification operation. This downward level shift therefore causes $V_{RES}$ to follow the solid line in FIG. 6 (no portion of which exceeds +Vref/2) during the main amplification operation. Similarly, during the pre-amplification operation, part of dashed-line section C goes lower than −Vref/2, causing digital logic 22 in FIG. 4A to kick in and generate a $V_{FB}$ value of +Vref which causes a upward level shift in the value of $V_{RES}$ during the main amplification operation. This upward level shift therefore causes $V_{RES}$ to be greater than −Vref/2 during the main amplification operation. This upward level shift causes $V_{RES}$ to follow the solid line in FIG. 6 (no portion of which is less than −Vref/2) during the main amplification operation.

Table 2 below conveys the same basic information as previously mentioned Table 1, but uses the foregoing terms "Vres(coarse)" and "Vres(fine)" as shown in the residue plot of FIG. 6.

TABLE 2 if −Vref/2 < Vres(coarse) < Vref/2, then $V_{FB}$ = zero (so that Vres (fine) = $V_{RES}$);
if Vref(coarse) > Vref/2, then $V_{FB}$ = −Vref (so that Vres(fine) = $V_{RES}$ −Vref); and
if Vref(coarse) < −Vref/2, then $V_{FB}$ = +Vref (so that Vres(fine) = $V_{RES}$ +Vref).

Thus, the overall residue amplification is performed in two steps. In the pre-amplification step, a coarse pre-amplification of the residue is performed, with substantially less accuracy then is required during the main amplification step. During the main amplification step, residue amplifier 11A needs to amplify with a higher level of accuracy determined by the resolution of pipeline ADC 14 (FIG. 4B), such that the output voltage swing $V_{RES}$ of residue amplifier 11A never goes above Vref/2 or below −Vref/2. This avoids the problems caused by excessive output swings of the residue amplifiers of prior art pipeline ADC stages. Also, the number of flash ADC comparators 8 in each "next" pipeline ADC stage 15 in pipeline ADC 14 is reduced by half. Furthermore, the required input offset voltage specification of the flash ADC comparators of each "next" pipeline ADC stage is substantially reduced compared to the input offset specification required in the flash ADCs of a conventional pipeline ADC.

In one implementation of pipeline ADC 14 in FIGS. 4A and 4B, only a single pair of level-detect comparators is needed and it is shared by all of the pipeline ADC stages which follow the input stage 15-1. In this implementation the waveforms in the timing diagram of FIG. 6 are successively applied to each pipeline ADC stage. In another implementation, a single residue amplifier is shared between all of the pipeline ADC stages. For example, if pipeline ADC 14 (FIG. 4B) is a 12-bit ADC which includes 4 stages each having 3 bits, the analog input $V_{IN}$ of pipeline ADC 14 is sampled, and then an entire ADC conversion process is performed. Only after that complete conversion by pipeline ADC 14 has been completed can $V_{IN}$ be sampled again. That allows the single residue amplifier to be shared across all four stages of the pipeline ADC. However, this arrangement does not allow sharing of level-detect comparators.

In another implementation, the first stage 15-1 of pipeline ADC 14 samples the input $V_{IN}$ and amplifies the residue. While the residue amplifier of the first stage 15-1 is amplifying its residue, the next stage 15-2 of pipeline ADC 14 is sampling the residue output of first stage 15-1. Once the amplification of the first stage residue is complete, the second stage of pipeline ADC 14 then amplifies its own residue, and simultaneously first stage 15-1 operates to sample $V_{IN}$ again. In this implementation, a single residue amplifier can not be shared between all the stages of pipeline ADC 14. However, a first residue amplifier may be shared between the first and second pipeline ADC stages, and second residue amplifier may be shared between the third and fourth pipeline ADC stages, and so forth. In any case, every stage must have its own MDAC and flash-ADC.

An advantage of pipeline ADC stage 15 of FIG. 4A is that the residue amplifier input offset voltage can individually be less than the value LSB/2, and all of the other errors summed together also can be less than LSB/2. This is contrast to a conventional pipeline ADCs, in which all errors, including comparator input offset and residue amplifier input offset IR voltage drop variations, etc., in combination must not exceed the LSB/2 value of the pipeline ADC stage. This reduces the input offset requirement of the flash-ADC comparators and also of the residue amplifier.

Using dynamic comparator 25 of FIG. 8 results in substantially reduced integrated circuit chip area and substantially reduced power dissipation of pipeline ADC 14. Only switching power during latch operation is consumed, whereas both static power and switching power are consumed by a conventional comparator which includes a preamplifier stage. Dynamic comparators may be used in the flash ADCs, which further reduces integrated circuit chip area and power dissipation, and also reduces switching power because a reduced number of clock signal lines is required in the pipeline ADC.

An advantage of pipeline ADC stage 15 FIG. 4A is that the residue voltage $V_{RES}$ never swings outside of the range +Vref/2. This means half of the comparators can be removed from the flash-ADC of the next stage, which saves a substantial amount of integrated circuit chip area and eliminates a substantial amount of power dissipation. For example, in a 12-bit ADC with a "(3-3-3-3)" split of the 12 bits between 4 pipeline ADC stages 15, only 36 flash-ADC comparators are needed, rather than the 56 flash-ADC comparators that would be needed if the level-detect comparators and associated digital circuitry are not used. (Note that the reduction in hold time available during the main amplification phase is compensated to some extent by the reduced capacitive loading by the reduced the number of flash ADC comparators required in the subsequent pipeline ADC stage.)

In a conventional pipeline ADC, all errors (comparator offset, amplifier offset, IR voltage drop and others) combined together must not exceed LSB/2 of the pipeline ADC. In contrast, in pipeline ADC stage 15 of FIG. 4A, residue amplifier input offset can individually be less than LSB/2 and all others errors summed together can be less than LSB/2. This reduces the offset spec of the sub-ADC comparators and allows dynamic comparators (without preamplifiers) to be used in the flash ADCs thereby reducing integrated circuit chip area and power consumption, and also reducing switching power due to a reduced number of clock lines in the pipeline ADC.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, although the disclosed pipeline ADC stage and technique provide an effective alternative to the prior art reference scaling technique, the two techniques may be combined to achieve the advantages of a reduced number of required flash ADC comparators, reduced residue amplifier output swing, and reduced DC gain and bandwidth of the residue amplifier, for example, in a very low supply voltage application. In that case, reference scaling could be used to limit the residue amplifier output swing to the range ±Vref/4, although some of the advantage achieved by reducing the flash-ADC comparator input offset requirements would be lost. Although the flash-ADC as a practical matter is almost always a flash-ADC, it could be another type of ADC.

What is claimed is:

1. A pipeline ADC (analog-to-digital converter) including a pipeline ADC stage, comprising:
    (a) a residue amplifier having a first input coupled to receive a first residue signal of a previous ADC stage;
    (b) a first sub-ADC having an input coupled to receive the first residue signal for resolving a predetermined number of bits and producing the predetermined number of bits and a redundancy bit in response to the first residue signal;
    (c) a first DAC (digital-to-analog converter) for converting the predetermined number of bits and the redundancy bit to an analog signal applied to a second input of the residue amplifier, the DAC having a level-shifting input for receiving a feedback signal, the residue amplifier amplifying a difference between the residue signal and the analog signal to generate a second residue signal; and
    (d) level-detect circuitry receiving the second residue signal and generating the first feedback signal if the second residue signal is outside of a predetermined voltage range so as to cause the first DAC to shift the second residue signal back within the predetermined voltage range by the end of the amplifying.

2. The pipeline ADC of claim 1 wherein the previous ADC stage is essentially the same as the pipeline ADC stage.

3. The pipeline ADC of claim 1 wherein the previous ADC stage is a first ADC stage of the pipeline ADC.

4. The pipeline ADC of claim 1 wherein the sub-ADC includes $2^m$ comparators the outputs of which produce the resolved bits, where m is an effective number of bits, excluding the redundancy bit, resolved by the pipeline ADC stage.

5. The pipeline ADC of claim 4 wherein the first sub-ADC is a m bit flash-ADC.

6. The pipeline ADC of claim 1 wherein the DAC includes an MDAC (multiplying DAC).

7. The pipeline ADC of claim 1 wherein the level-detect circuitry includes first and second comparators each having an output coupled to an input of a logic circuit, a first input of each of the first and second comparators being coupled to the second residue signal, a second input of the first comparator being coupled to a first reference voltage which corresponds to an upper end of the predetermined voltage range, and a second input of the second comparator being coupled to a second reference voltage which corresponds to a lower end of the predetermined voltage range, an output of the logic circuit providing the feedback signal.

8. The pipeline ADC of claim 1 wherein the level-detect circuitry operates in accordance with the truth table if −Vref/2 < Vres(coarse) < Vref/2, then $V_{FB}$ = zero (so that $V_{RES}$ is not shifted);
if Vref(coarse) > Vref/2, then $V_{FB}$ = −Vref (so that $V_{RES}$ is shifted by −Vref); and
if Vref(coarse) < −Vref/2, then $V_{FB}$ = +Vref (so that $V_{RES}$ is shifted by +Vref), where Vref is a reference voltage of the pipeline ADC, Vres(coarse) is a pre-amplified value of the second residue signal, and $V_{FB}$ is the feedback signal.

9. The pipeline ADC of claim 1 wherein the predetermined voltage range is equal to one half of a reference voltage applied to the DAC.

10. The pipeline ADC of claim 5 wherein the comparators of the sub-ADC are dynamic comparators.

11. The pipeline ADC of claim 1 wherein the residue amplifier, the DAC, and sample/hold circuitry are combined in a single circuit module.

12. The pipeline ADC of claim 11 wherein the amplifying includes a pre-amplification phase without shifting the value of the second residue signal in response to the feedback signal, followed by a main amplification phase which includes shifting of the second residue signal in response to the feedback signal to keep the second residue signal within the predetermined voltage range.

13. The pipeline ADC of claim 12 wherein the pre-amplification phase occurs with substantially lower accuracy than the main amplification phase.

14. The pipeline ADC of claim 1 including level-shifting circuitry having an input coupled to the first input of the residue amplifier, the level-shifting circuitry causing the residue amplifier to produce
   a zero level shift of an output of the residue amplifier in response to a "0" level of the feedback signal,
   a first polarity level shift of the output of the residue amplifier in response to a "1" level of the feedback signal, and
   a second polarity level shift of an output of the residue amplifier in response to a "−1" level of the feedback signal.

15. A method of operating a pipeline ADC (analog-to-digital converter) including a pipeline ADC stage, the method comprising:
   (a) applying a first residue signal to a first input of a residue amplifier and to an input of a sub-ADC for resolving a predetermined number of bits;
   (b) operating the sub-ADC to produce the predetermined number of resolved bits and a redundancy bit in response to the first residue signal;
   (c) converting the predetermined number of resolved bits and the redundancy bit to an analog signal and applying the analog signal to a second input of the residue amplifier;
   (d) amplifying the difference between the first residue signal and the analog signal to generate a second residue signal; and
   (e) if the second residue signal is outside of a predetermined voltage range, then causing the residue amplifier to shift the second residue signal back within the predetermined voltage range by the end of the amplifying phase.

16. The method of claim 15 wherein step (e) includes operating level-detect circuitry in accordance with the truth table

--- if $-\text{Vref}/2 < \text{Vref(coarse)} < \text{Vref}/2$, then $V_{FB}$ = zero (so that $V_{RES}$ is not shifted);
if $\text{Vref(coarse)} > \text{Vref}/2$, then $V_{FB} = -\text{Vref}$ (so that $V_{RES}$ is shifted by $-\text{Vref}$); and
if $\text{Vref(coarse)} < -\text{Vref}/2$, then $V_{FB} = +\text{Vref}$ (so that $V_{RES}$ is shifted by $+\text{Vref}$),

--- where Vref is a reference voltage of the pipeline ADC, Vres(coarse) is a pre-amplified value of the second residue signal, and $V_{FB}$ is the feedback signal.

17. The method of claim 16 wherein step (c) includes utilizing a DAC (digital-to-analog converter) having a level-shifting input to shift the second input of the residue amplifier so as to superimpose a level shift on the second residue signal so as to shift it back within the predetermined voltage range.

18. The method of claim 15 including repeating steps (a) through (e) for a next pipeline ADC stage.

19. The method of claim 15 including providing $2^{m-1}$ comparators in the sub-ADC.

20. A pipeline ADC (analog-to-digital converter), comprising:
   (a) means for applying a first residue signal to a first input of a residue amplifier and to an input of a sub-ADC for resolving a predetermined number of bits;
   (b) means in the sub-ADC for producing the predetermined number of bits and a redundancy bit in response to the first residue signal;
   (c) means for converting the predetermined number of bits and the redundancy bit to an analog signal and applying the analog signal to a second input of the residue amplifier;
   (d) means for amplifying the difference between the first residue signal and the analog signal to generate a second residue signal; and
   (e) means for causing the residue amplifier to shift the second residue signal back within the predetermined voltage range by the end of the amplifying if the second residue signal is outside of a predetermined voltage range.

* * * * *